(12) United States Patent
Carter et al.

(10) Patent No.: US 8,378,432 B2
(45) Date of Patent: Feb. 19, 2013

(54) MAINTAINING INTEGRITY OF A HIGH-K GATE STACK BY AN OFFSET SPACER USED TO DETERMINE AN OFFSET OF A STRAIN-INDUCING SEMICONDUCTOR ALLOY

(75) Inventors: Richard Carter, Dresden (DE); Sven Beyer, Dresden (DE); Martin Trentzsch, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 202 days.

(21) Appl. No.: 12/748,992

(22) Filed: Mar. 29, 2010

(65) Prior Publication Data
US 2010/0244155 A1    Sep. 30, 2010

(30) Foreign Application Priority Data
Mar. 31, 2009    (DE) .................... 10 2009 015 715

(51) Int. Cl.
  *H01L 21/02* (2006.01)
  *H01L 29/66* (2006.01)
(52) U.S. Cl. .................. 257/410; 257/339; 257/340
(58) Field of Classification Search .......... 257/410, 257/339–340; 438/510–569
See application file for complete search history.

(56) References Cited

U.S. PATENT DOCUMENTS

| | | | | |
|---|---|---|---|---|
| 6,716,689 B2 * | 4/2004 | Bae et al. | | 438/182 |
| 6,888,198 B1 * | 5/2005 | Krivokapic | | 257/347 |
| 6,906,360 B2 * | 6/2005 | Chen et al. | | 257/204 |
| 6,911,695 B2 * | 6/2005 | Ahmed et al. | | 257/336 |
| 7,718,500 B2 * | 5/2010 | Chong et al. | | 438/300 |
| 7,820,500 B2 * | 10/2010 | Ning | | 438/199 |
| 2005/0029601 A1 * | 2/2005 | Chen et al. | | 257/369 |
| 2005/0035470 A1 * | 2/2005 | Ko et al. | | 257/900 |
| 2006/0065914 A1 * | 3/2006 | Chen et al. | | 257/288 |
| 2006/0118878 A1 | 6/2006 | Huang et al. | | 257/369 |
| 2008/0119019 A1 * | 5/2008 | Han et al. | | 438/197 |
| 2008/0191243 A1 * | 8/2008 | Liu et al. | | 257/190 |
| 2010/0224937 A1 * | 9/2010 | Sridhar | | 257/369 |

OTHER PUBLICATIONS

Translation of Official Communication from German Patent Office for German Patent Application No. 10 2009 015 715.8-33 dated Apr. 14, 2010.

* cited by examiner

*Primary Examiner* — Fernando L Toledo
*Assistant Examiner* — Karen Kusumakar
(74) *Attorney, Agent, or Firm* — Williams, Morgan & Amerson, P.C.

(57) ABSTRACT

In sophisticated transistor elements including a high-k gate metal stack, the integrity of the sensitive gate materials may be ensured by a spacer element that may be concurrently used as an offset spacer for defining a lateral offset of a strain-inducing semiconductor alloy. The cap material of the sophisticated gate stack may be removed without compromising integrity of the offset spacer by providing a sacrificial spacer element. Consequently, an efficient strain-inducing mechanism may be obtained in combination with the provision of a sophisticated gate stack with the required material integrity, while reducing overall process complexity compared to conventional strategies.

25 Claims, 8 Drawing Sheets

MAINTAINING INTEGRITY OF A HIGH-K GATE STACK BY AN OFFSET SPACER USED TO DETERMINE AN OFFSET OF A STRAIN-INDUCING SEMICONDUCTOR ALLOY

BACKGROUND OF THE INVENTION

1. Field of the Invention

Generally, the present disclosure relates to the fabrication of highly sophisticated integrated circuits including advanced transistor elements that comprise strain-inducing semiconductor alloys and gate structures of increased capacitance including a high-k gate dielectric.

2. Description of the Related Art

The fabrication of advanced integrated circuits, such as CPUs, storage devices, ASICs (application specific integrated circuits) and the like, requires the formation of a large number of circuit elements on a given chip area according to a specified circuit layout. In a wide variety of circuits, field effect transistors represent one important type of circuit element that substantially determines performance of the integrated circuits. Generally, a plurality of process technologies are currently practiced for forming field effect transistors, wherein, for many types of complex circuitry, MOS technology is currently one of the most promising approaches due to the superior characteristics in view of operating speed and/or power consumption and/or cost efficiency. During the fabrication of complex integrated circuits using, for instance, MOS technology, millions of transistors, e.g., N-channel transistors and/or P-channel transistors, are formed on a substrate including a crystalline semiconductor layer. A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, such as a channel region, disposed adjacent to the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on the dopant concentration, the mobility of the charge carriers and, for a given extension of the channel region in the transistor width direction, on the distance between the source and drain regions, which is also referred to as channel length. Hence, the conductivity of the channel region substantially affects the performance of MOS transistors. Thus, as the speed of creating the channel, which depends on the conductivity of the gate electrode, and the channel resistivity substantially determine the transistor characteristics, the scaling of the channel length, and associated therewith the reduction of channel resistivity which in turn causes an increase of gate resistivity due to the reduced dimensions, is a dominant design criterion for accomplishing an increase in the operating speed of the integrated circuits.

Presently, the vast majority of integrated circuits is based on silicon due to its substantially unlimited availability, the well-understood characteristics of silicon and related materials and processes and the experience gathered during the last 50 years. Therefore, silicon will likely remain the material of choice for future circuit generations designed for mass products. One reason for the dominant role of silicon in fabricating semiconductor devices has been the superior characteristics of a silicon/silicon dioxide interface that allows reliable electrical insulation of different regions from each other. The silicon/silicon dioxide interface is stable at high temperatures and, thus, allows the performance of subsequent high temperature processes as are required, for example, during anneal cycles to activate dopants and to cure crystal damage without sacrificing the electrical characteristics of the interface.

For the reasons pointed out above, in field effect transistors, silicon dioxide is preferably used as a gate insulation layer that separates the gate electrode, frequently comprised of polysilicon or other metal-containing materials, from the silicon channel region. In steadily improving device performance of field effect transistors, the length of the channel region has continuously been decreased to improve switching speed and drive current capability. Since the transistor performance is controlled by the voltage supplied to the gate electrode to invert the surface of the channel region to a sufficiently high charge density for providing the desired drive current for a given supply voltage, a certain degree of capacitive coupling, provided by the capacitor formed by the gate electrode, the channel region and the silicon dioxide disposed therebetween, has to be maintained. It turns out that decreasing the channel length requires an increased capacitive coupling to avoid the so-called short channel behavior during transistor operation. The short channel behavior may lead to an increased leakage current and to a dependence of the threshold voltage on the channel length. Aggressively scaled transistor devices with a relatively low supply voltage and thus reduced threshold voltage may suffer from an exponential increase of the leakage current while also requiring enhanced capacitive coupling of the gate electrode to the channel region. Thus, the thickness of the silicon dioxide layer has to be correspondingly decreased to provide the required capacitance between the gate and the channel region. For example, a channel length of approximately 80 nm may require a gate dielectric made of silicon dioxide as thin as approximately 1.2 nm. Although, usage of high speed transistor elements having an extremely short channel may be restricted to high speed signal paths, whereas transistor elements with a longer channel may be used for less critical applications, such as storage transistor elements, the relatively high leakage current caused by direct tunneling of charge carriers through an ultra-thin silicon dioxide gate insulation layer may reach values for an oxide thickness in the range or 1-2 nm that may not be compatible with requirements for performance driven circuits, even if only transistors in speed critical paths are formed on the basis of an extremely thin gate oxide.

Therefore, replacing silicon dioxide as the material for gate insulation layers has been considered, particularly for extremely thin silicon dioxide gate layers. Possible alternative materials include materials that exhibit a significantly higher permittivity so that a physically greater thickness of a correspondingly formed gate insulation layer provides a capacitive coupling that would be obtained by an extremely thin silicon dioxide layer. Commonly, a thickness required for achieving a specified capacitive coupling with silicon dioxide is referred to as capacitance equivalent thickness (CET). Thus, at a first glance, it appears that simply replacing the silicon dioxide with high-k materials is a straightforward way to obtain a capacitance equivalent thickness in the range of 1 nm and less.

It has thus been suggested to replace silicon dioxide with high permittivity materials, such as tantalum oxide ($Ta_2O_5$), with a k of approximately 25, strontium titanium oxide ($SrTiO_3$), having a k of approximately 150, hafnium oxide ($HfO_2$), HfSiO, zirconium oxide ($ZrO_2$) and the like.

Additionally, transistor performance may be increased by providing an appropriate conductive material for the gate electrode to replace the usually used polysilicon material, since polysilicon may suffer from charge carrier depletion at the vicinity of the interface to the gate dielectric, thereby reducing the effective capacitance between the channel region and the gate electrode. Thus, a gate stack has been suggested in which a high-k dielectric material provides an increased capacitance based on the same thickness as a silicon dioxide layer, while additionally maintaining leakage currents at an acceptable level. On the other hand, the non-polysilicon material, such as titanium nitride and the like, may be formed so as to connect to the high-k dielectric material, thereby substantially avoiding the presence of a depletion zone.

After forming sophisticated gate structures including a high-k dielectric and a metal-based gate material, however, high temperature treatments may be required, which may result in a shift of the work function and a reduction of the permittivity of the gate dielectric, which may also be associated with an increase of layer thickness, thereby offsetting many of the advantages of the high-k dielectric in combination and the metal material. It is believed that the deterioration of the high-k metal gate is substantially caused by the incorporation of oxygen and a respective oxygen diffusion within the high-k dielectric material, wherein the oxygen diffusion may be fed by oxygen contained in the ambient that may come into contact with the high-k dielectric during the processing of the devices. Since, for instance, hafnium- and zirconium-based oxides grow very fast due to the high affinity to oxygen diffusion even at moderately high temperatures, a significant modification of the characteristics of the high-k dielectric material may be observed, for instance an increased layer thickness and thus a reduced dielectric constant, which may even further be pronounced at moderately high temperatures of approximately 950-1300° C., as may typically be used during activation treatments and the like.

In addition to a significant modification of the high-k dielectric material, the work function of the metal in the gate stack may be shifted towards the center of the band gap, thereby modifying the threshold voltage of respective transistors. Due to the high oxygen affinity of the high-k dielectric material and the exposure to wet chemical etch procedures and cleaning processes, usually, the gate stack is encapsulated after the patterning process in order to enhance stability of the high-k dielectric material and the respective metals in the gate stack. For this purpose, silicon nitride has proven to be a promising material due to its oxygen blocking characteristics. Hence, in typical conventional process flows, a silicon nitride liner with a thickness is the range of approximately 1-5 nm may be formed on exposed surface areas of the patterned high-k gate stack, wherein appropriate deposition techniques are used so as to not unduly affect device characteristics and/or the subsequent manufacturing steps. For example, well-established low pressure chemical vapor deposition (LPCVD) techniques may be applied for forming the silicon nitride liner.

In addition to providing sophisticated gate electrode structures by using high-k dielectric materials and metal-containing gate electrode materials, other approaches have been developed in order to enhance transistor performance for a given gate length and a thickness of a gate dielectric material. For example, by creating a certain strain component in the channel region of the transistor elements, the charge carrier mobility and thus the overall conductivity of the channel may be enhanced. For a silicon material having a standard crystallographic configuration, i.e., a (100) surface orientation with the channel length direction oriented along a <110> equivalent direction, the creation of a tensile strain component in the current flow direction, may enhance conductivity of electrons, thereby improving transistor performance of N-channel transistors. On the other hand, generating a compressive strain component in the current flow direction may increase hole mobility and thus provide superior conductivity in P-channel transistors. Consequently, a plurality of strain-inducing mechanisms have been developed in the past which may per se require a complex manufacturing sequence for implementing the various strain-inducing techniques. For example, one promising approach that is frequently applied is the incorporation of a compressive strain-inducing silicon/germanium alloy in the drain and source areas of P-channel transistors. For this purpose, in an early manufacturing stage, cavities are formed selectively adjacent to the gate electrode structure of the P-channel transistor, while the N-channel transistors are covered by a spacer layer. Additionally, the gate electrode of the P-channel transistor has to be encapsulated in order to not unduly expose the gate electrode material to the etch ambient for forming the cavities and also providing an efficient growth mask during the selective epitaxial growth process, in which the silicon/germanium alloy may be grown on a crystalline substrate material, while a significant deposition of the alloy on dielectric surface areas may be suppressed by appropriately selecting the corresponding process parameters. After forming the strain-inducing silicon/germanium alloy, the corresponding spacer structure and a cap layer encapsulating the gate electrode of the P-channel transistor may be removed along with the spacer layer that covers the N-channel transistors. Thereafter, the further processing may be continued by forming drain and source regions so as to complete the basic transistor configuration.

A corresponding strain-inducing mechanism is a very efficient concept for improving transistor performance and thus a combination with sophisticated gate electrode structures on the basis of high-k dielectric materials and metal gate electrodes is highly desirable. However, it turns out that the combination of both complex process sequences may cause integrity issues with respect to the sensitive high-k dielectric material, since the corresponding protection liner may be unduly exposed to a reactive etch ambient, in particular when a reduced width of the offset spacer is to be used in order to enhance the strain-inducing effect of the silicon/germanium alloy.

That is, during the removal of the offset spacer element, which may frequently be combined with the removal of the cap layer and the corresponding spacer layer formed above the gate electrode structures of other transistor elements, material of the protection liner may also be removed, thereby possibly exposing corresponding sidewall portions of the sensitive high-k dielectric material and/or of the metal-containing electrode material, which may thus result in a significant variability of the finally obtained transistor characteristics, as previously discussed. Consequently, complex manufacturing sequences have been proposed so as to reduce the lateral offset of the silicon/germanium alloy on the basis of dedicated offset spacers, which have to be removed in a later stage in combination with the corresponding cap material without unduly compromising integrity of the protection liner, at least at the bottom of the gate electrode structures.

In view of the situation described above, the present disclosure relates to techniques and semiconductor devices in which a reduced lateral offset of a strain-inducing semiconductor alloy may be obtained in the context of sophisticated high-k metal gate structures while avoiding, or at least reducing, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides techniques and semiconductor devices in which a protective liner or spacer element may be formed on sidewalls of a complex gate electrode structure, which may at the same time be used as an efficient offset spacer element to enable the formation of a strain-inducing semiconductor alloy in close proximity to a channel region at significantly reduced overall process complexity compared to conventional strategies in which a protective liner material and a dedicated offset spacer may typically be employed. To this end, an appropriate manufacturing sequence may be used in which the integrity of the protective sidewall spacer may be maintained during an etch process applied to remove the cap materials of the gate electrode structures. For this purpose, a dedicated offset spacer element may be formed on the previously provided protected spacer element so that the cap material may be efficiently removed while maintaining integrity of the sensitive gate electrode materials.

One illustrative method disclosed herein comprises forming a first spacer element on at least a portion of sidewalls of a gate stack that is formed on a semiconductor layer and comprises a gate insulation layer comprising a high-k dielectric material, a gate electrode material and a cap layer formed above the gate electrode material. The method further comprises forming a semiconductor alloy in the semiconductor layer laterally offset from the gate stack on the basis of the first spacer element. Moreover, a second spacer element is formed on the first spacer element and the cap layer is removed selectively to the second spacer element and the semiconductor alloy. Moreover, the method comprises forming drain and source regions in at least a portion of the semiconductor alloy on the basis of the first spacer element.

A further illustrative method disclosed herein comprises forming a first offset spacer element at least on a portion of sidewalls of a first gate stack that is formed above a first semiconductor region. The method additionally comprises forming a deposition mask above a second semiconductor region having formed thereabove a second gate stack, wherein the first and second gate stacks comprise a high-k dielectric gate insulation layer, a metal-containing electrode material formed on the high-k dielectric gate insulation layer and a cap layer formed above the metal-containing electrode material. Furthermore, the method comprises forming a semiconductor alloy in the first semiconductor region by using the first offset spacer element as a mask. Additionally, a second offset spacer element is formed on at least a portion of the second gate stack and the cap layers of the first and second gate stacks are removed while maintaining at least a portion of the first and second offset spacer elements.

One illustrative transistor device disclosed herein comprises a gate electrode structure comprising a metal-containing electrode material formed on a gate insulation layer that comprises a high-k dielectric material. The transistor device further comprises an active region comprising a channel region, drain and source regions and a strain-inducing semiconductor alloy. Moreover, the transistor device comprises a spacer structure formed on sidewalls of the gate electrode structure and comprising a protection spacer that is in direct contact with a sidewall face of the high-k dielectric material, wherein the protection spacer has a width that is substantially equal to a lateral offset of the strain-inducing semiconductor alloy from the sidewall face.

BRIEF DESCRIPTION OF THE DRAWINGS

The disclosure may be understood by reference to the following description taken in conjunction with the accompanying drawings, in which like reference numerals identify like elements, and in which:

FIGS. 1$l$-1$n$ schematically illustrate cross-sectional views of the semiconductor device according to further illustrative embodiments in which a protective spacer may be formed without additional lithography steps by forming the protective spacer in different transistors during a common patterning sequence and providing a dedicated deposition mask layer for one type of transistor; and FIGS. 1$o$-1$p$ schematically illustrate cross-sectional views of the semiconductor device according to still further illustrative embodiments in which the protective or offset spacer elements may also be formed without additional lithography processes by using a dedicated deposition mask layer.

Figure 1A:
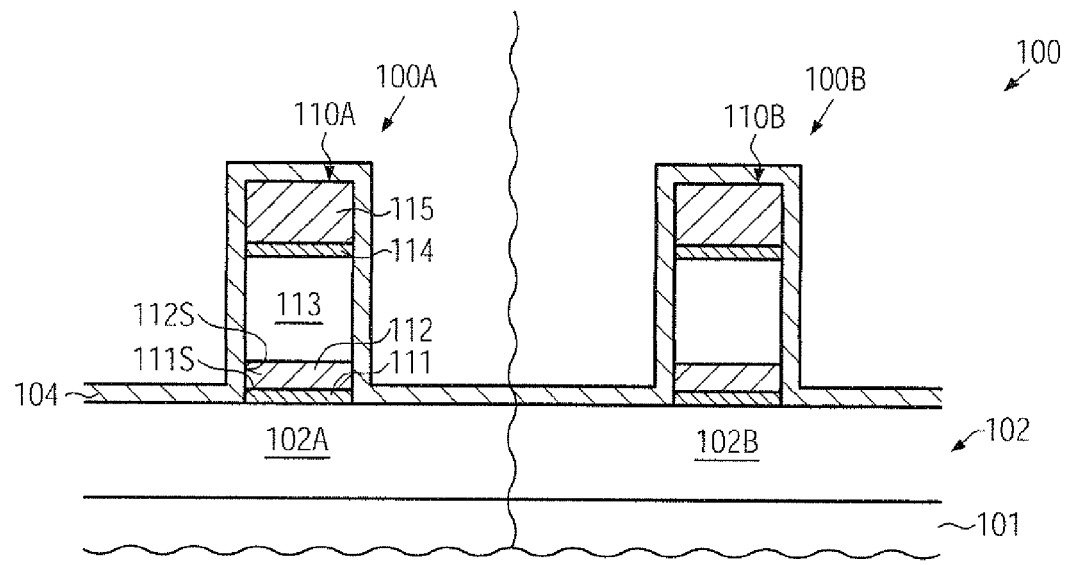
FIGS. 1$a$-1$k$ schematically illustrate cross-sectional views of a semiconductor device during various manufacturing stages in forming transistor elements with complex gate electrode structures, wherein a spacer element may be used as a protective spacer and an offset spacer for maintaining integrity of sensitive gate stack materials and defining a desired lateral offset of a strain-inducing semiconductor alloy, according to illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the subject matter disclosed herein provides techniques and semiconductor devices in which integrity of sidewalls of sensitive materials of gate electrode structures may be maintained on the basis of a spacer element which may concurrently be used as an offset spacer for defining the lateral offset of a strain-inducing semiconductor alloy. Moreover, the integrity of the protective spacer or offset spacer may be maintained in the subsequent manufacturing processes in which the cap materials of the gate electrode structures may be removed, which may be accomplished by providing an additional spacer element that covers the previously formed offset spacer. Consequently, in some illustrative embodiments disclosed herein, well-established and efficient materials may be used for the cap layer of the gate electrode structures and the protective spacer or offset spacer, for instance in the form of silicon nitride and the like, while, nevertheless, the integrity of the offset spacer may be maintained during the removal of the cap layers. Furthermore, due to the fact that the protective spacer element may be concurrently used as an offset spacer, a reduced offset may be achieved, which may be substantially determined by a minimum width of the offset spacer as required for maintaining integrity of the sensitive gate electrode materials, thereby accomplishing a significantly enhanced overall efficiency of the strain-inducing mechanism provided by the semiconductor alloy, which may be provided in the form of a compressive strain-inducing material or a tensile strain-inducing material. Consequently, a lateral offset in the range of approximately 1-5 nm may be efficiently realized without affecting overall integrity of complex high-k gate electrode stacks. Hence, any manufacturing strategies in which sensitive materials, such as a high-k dielectric material in combination with a metal-containing electrode material, may be provided in an early manufacturing stage, may be applied with a reduced overall process complexity compared to conventional strategies, while at the same time a reduced desired lateral offset of the strain-inducing semiconductor alloy may be achieved.

FIG. 1a schematically illustrates a cross-sectional view of a semiconductor device 100, which may comprise a substrate 101, such as a silicon substrate, an insulating carrier material and the like, above which may be formed a semiconductor layer 102, which may represent, in some illustrative embodiments, a silicon-based material whose electronic characteristics may be modified by introducing a semiconductor alloy, as will be explained later on in more detail. The semiconductor layer 102 may comprise any other appropriate components, such as dopants and the like, as may be required in this manufacturing stage. Furthermore, the substrate 101 in combination with the semiconductor layer 102 may represent a silicon-on-insulator (SOI) configuration when a buried insulating layer (not shown) is formed between the substrate 101 and the semiconductor layer 102. In other cases, a "bulk" configuration may be applied in which the semiconductor layer 102 may be formed on a substantially crystalline semiconductor material of the substrate 101. It should further be appreciated that, if required, an SOI configuration and a bulk configuration may be concurrently realized in the device 100 in different device regions, if considered appropriate. In the manufacturing stage shown, a first active region 102B and a second active region 102A may be provided in the semiconductor layer 102 and may be separated by an isolation structure (not shown). The active regions 102B, 102A may have formed thereabove corresponding gate stacks or gate electrode structures 110B, 110A, which may represent components of transistors 100B, 100A that have to be formed in and above the corresponding active regions 102B, 102A. In the embodiment shown, it may be assumed that at least one of the transistors 100B, 100A, such as the transistor 100B, may require the incorporation of a semiconductor alloy into a portion of the active region 102B in order to enhance overall transistor performance, for instance by inducing an appropriate strain, as previously explained.

The gate stacks 110B, 110A may comprise a gate insulation layer 111 which may comprise a high-k dielectric material, for instance one of the materials as previously described. In this context, a high-k dielectric material is to be understood as any dielectric material having a dielectric constant of 10.0 or higher. The gate insulation layer 111 may further comprise a "conventional" dielectric material, such as silicon dioxide, however, with a reduced thickness of approximately 1 nm and less, if a well-established interface with material of the active regions 102A, 102B is considered advantageous. In other cases, any other appropriate conventional dielectric material, such as silicon nitride and the like, may be used in combination with a high-k dielectric material. A thickness of corresponding high-k dielectric material may range from one to several nanometers when, for instance, hafnium oxide is used. In other cases, an even increased thickness may be applied when a material of increased dielectric constant is used. Moreover, the gate stacks 110A, 110B may comprise a metal-containing electrode material 112 that may be formed directly on the gate insulation layer 111, wherein the electrode material 112 may comprise titanium nitride, aluminum oxide and the like, depending on the overall device and process requirements. It should be appreciated that the electrode material 112 may have an appropriate work function in order to establish a desired threshold voltage of the transistors 100A, 100B, which may be accomplished by selecting an appropriate material composition for the material 112, possibly in combination with appropriately configuring at least a portion of the active regions 102A or 102B. For example, a threshold adjusting semiconductor material may be formed in one or both of the active regions 102A, 102B, for instance in the form of silicon/germanium and the like, so as to obtain a different band gap adjusting for the transistors 100A, 100B for a given configuration of the gate stacks 110A, 110B. In other cases, different material compositions may be used for the material 112 in the gate stack 110A and 110B, respectively. In still other illustrative embodiments, the work function and thus the threshold voltage of the transistors 100A, 100B may be adjusted in a later manufacturing stage, i.e., after completing the basic transistor configuration.

In the manufacturing stage shown, the gate stacks 110A, 110B may additionally comprise a further electrode material or placeholder material 113, such as polysilicon, followed by an etch stop liner 114, such as a silicon dioxide material and the like. Finally, the gate stacks 110A, 110B may comprise a cap layer 115, for instance in the form of a silicon nitride material, while, in other cases, any other appropriate cap material may be used. Furthermore, a spacer layer 104 may be formed on the active regions 102A, 102B and on the gate stacks 110A, 110B. The spacer layer 104 may, in one illustrative embodiment, be comprised of silicon nitride with a desired thickness to act as a protective liner material during the further processing of the device 100 in order to maintain integrity of at least side faces 112S, 111S of the sensitive materials in the layers 111 and 112. For this purpose, in some illustrative embodiments, the spacer layer 104 may be provided with a thickness of approximately one to several nanometers wherein a thickness may additionally be selected with respect to a desired lateral offset of a semiconductor alloy still to be formed in at least one of the active regions 102A, 102B. That is, if a desired offset of the corresponding semiconductor alloy is greater than a minimum layer thickness required for ensuring integrity of the sidewall faces 112S, 111S, the thickness of the spacer layer 104 may be selected in accordance with the desired lateral offset.

The semiconductor device 100 as illustrated in FIG. 1a may be formed on the basis of the following processes. After forming any isolation structures (not shown) and establishing an appropriate dopant profile in the active regions 102B, 102A as required, the gate stacks 110B, 110A may be formed. To this end, the gate insulation layer 111, possibly including a conventional dielectric material as explained above, may be formed by oxidation and/or deposition followed by the deposition of an appropriate high-k dielectric material, such as hafnium oxide and the like. For this purpose, well-established chemical vapor deposition (CVD), physical vapor deposition (PVD) and the like may be used. Thereafter, a process sequence may be applied in which the electrode materials 112 may be deposited so as to have the desired characteristics, for instance in view of work function and the like, followed by the deposition of the additional electrode or placeholder material 113, which may be accomplished by depositing a silicon material, a silicon/germanium material and the like, in a substantially amorphous or polycrystalline state. Next, the liner 114 may be deposited, followed by the deposition of the cap layer 115. Next, a patterning sequence on the basis of complex lithography and etch techniques may be applied in order to obtain the gate electrode structures 110A, 110B with the desired gate length, i.e., in FIG. 1a, the horizontal extension of the electrode materials 112, in the range of approximately 50 nm and less, if sophisticated semiconductor devices are considered. Thereafter, the spacer layer 104 may be deposited, for instance, on the basis of atomic layer deposition (ALD), thermally activated CVD and the like, in order to obtain a dense material, for instance in the form of a silicon nitride material, while also the thickness thereof may be adjusted in view of achieving the desired integrity and offset during the further processing of the device 100.

Figure 1B:
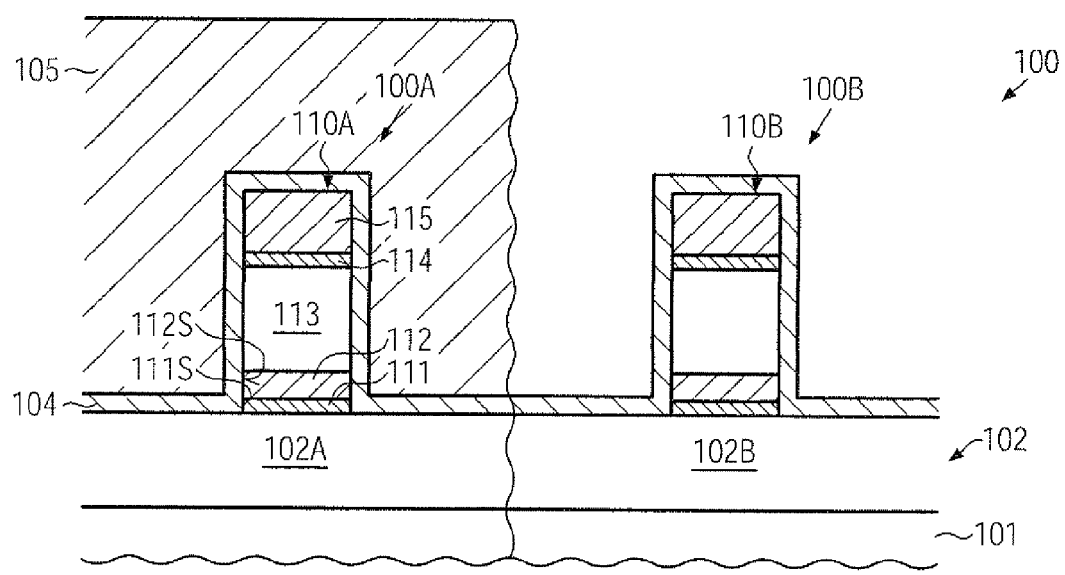

FIG. 1b schematically illustrates the semiconductor device 100 in an advanced manufacturing stage in which an etch mask, such as a resist mask or any other polymer material and the like, may cover the transistor 100A, i.e., the gate stack 110A, the region 102A and the spacer layer 104 formed thereon, while the transistor 100B, i.e., the spacer layer 104 formed thereon, may be exposed. The etch mask 105 may be formed on the basis of well-established lithography techniques.

Figure 1C:
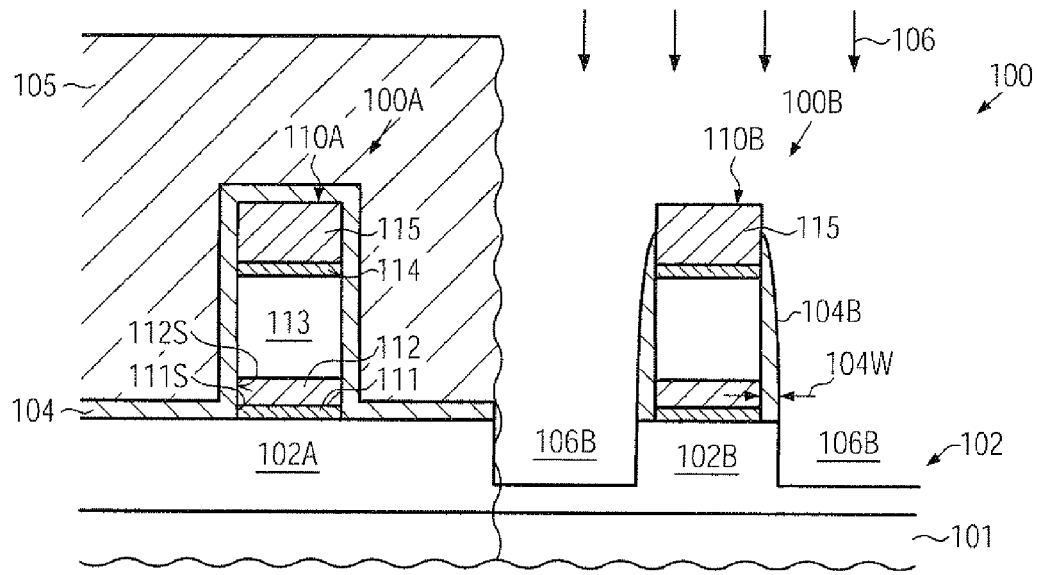

FIG. 1c schematically illustrates the semiconductor device 100 when exposed to an etch ambient 106. The etch ambient 106 may be established on the basis of an appropriate chemistry within a plasma assisted etch atmosphere so as to remove material of the spacer layer 104 selectively to the etch mask 105, thereby maintaining the spacer layer 104 above the transistor 100A, while forming spacer elements 104B on at least a portion of the sidewall of the gate stack 110B. The spacer 104B may be referred to as a protective spacer or an offset spacer, since a width 104W of the spacer 104B may substantially define a lateral offset of cavities 106B that may be formed in the active region 102B during the further advance of the etch sequence 106. At the same time, the spacer element 104B may provide integrity of at least a lower portion of the gate stack 110B. It should be appreciated that the etch process 106 may comprise an additional etch step based on a different etch chemistry to remove material of the active region 102B selectively to the spacer 104B and the cap layer 115, while, in other cases, a pronounced etch selectivity may not be required as long as material consumption of the spacer 104B in the vertical direction and of the cap layer 115 may still ensure encapsulation of the materials 113, 112 and 111. For instance, well-established anisotropic etch techniques may be applied for obtaining the spacer element 104B followed by any other appropriate anisotropic plasma assisted or wet chemical etch processes. After the etch sequence 106, the etch mask 105 may be removed on the basis of any well-established removal processes, such as plasma assisted oxygen ash-processing, wet chemical resist strip processes and the like.

Figure 1D:
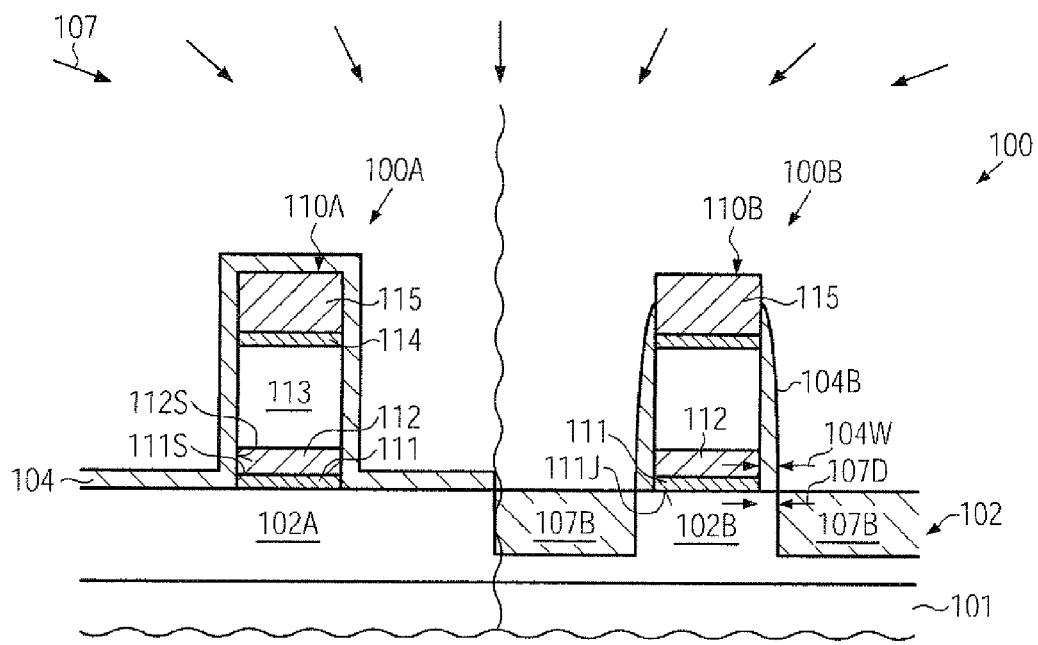

FIG. 1d schematically illustrates the semiconductor device 100 in a further advanced manufacturing stage. As illustrated, the semiconductor device 100 may be subjected to a selective epitaxial growth process 107 in order to fill in a desired semiconductor alloy 107B in the previously formed cavities 106B (FIG. 1c). During the selective epitaxial growth process, which may be performed on the basis of any appropriate deposition recipe, the mask layer 104 formed on the active region 102A and the gate stack 110A may act as a deposition mask, while undue material deposition on the gate stack 110B may be substantially suppressed by the cap layer 115 in combination with the spacer 104B. Consequently, a lateral offset 107D of the semiconductor alloy 107B with respect to the electrode material 112 may be determined, at least at a height level that corresponds to an interface 111J between the gate insulation layer 111 and the active region 102B, by the width 104W of the spacer 104B. It should be appreciated that the semiconductor alloy 107B may represent any appropriate strain-inducing material in order to enhance performance of the transistor 100B. For example, the material 107B may comprise a silicon/germanium alloy, a silicon/tin alloy, a silicon/tin/germanium alloy, when a compressive strain component is considered appropriate for enhancing performance of the transistor 100B. In other cases, the semiconductor alloy 107B may comprise a tensile strain-inducing material, such as a silicon/carbon alloy and the like, which may, for instance, be advantageous for N-channel transistors.

Figure 1E:
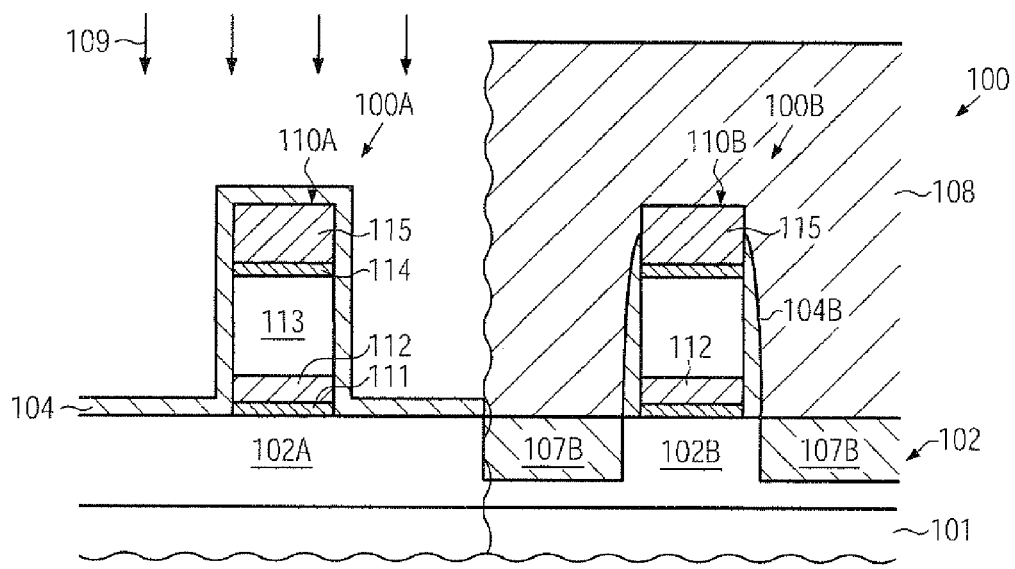

FIG. 1e schematically illustrates the semiconductor device 100 in a further advanced manufacturing stage in which an etch mask 108, such as a resist mask, may cover the transistor 100B, while the transistor 100A may be exposed to an etch ambient 109. The etch ambient 109 may be established on the basis of any appropriate etch chemistry in a plasma assisted ambient so as to obtain an anisotropic etch behavior in which material of the exposed spacer layer 104 may be removed selectively to the etch mask 108 and selectively to material of the active region 102A. As previously explained with reference to the etch process 106 (FIG. 1c), corresponding selective etch recipes are available for a plurality of material systems, such as silicon nitride and silicon and the like.

Figure 1F:
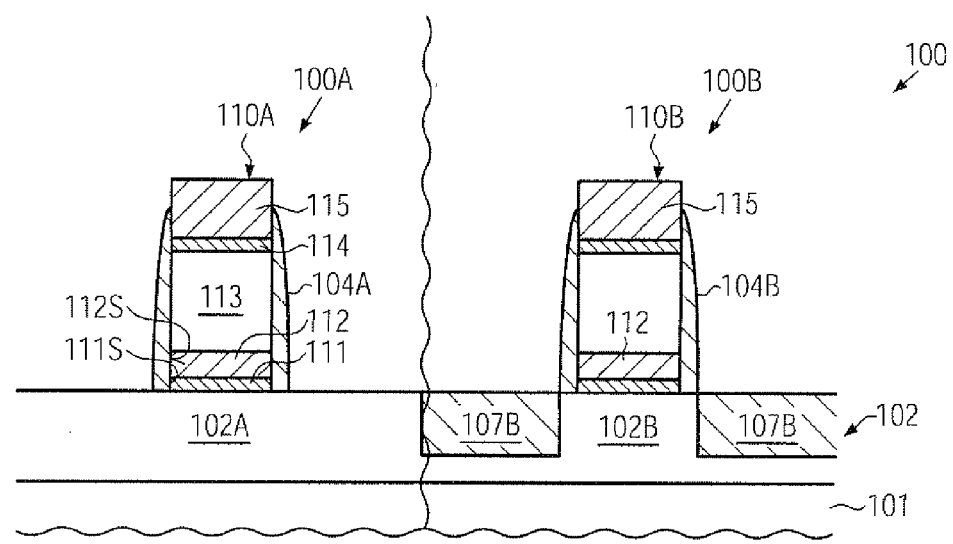

FIG. 1f schematically illustrates the semiconductor device 100 after the above-described process sequence and after removing the etch mask 108 (FIG. 1e). As illustrated, a spacer element 104A may be formed on at least a portion of sidewalls of the gate stack 110A, which may thus reliably confine the side surfaces 111S, 112S in order to ensure integrity of the sensitive materials 111 and 112 during the further processing. Similarly, the spacer 104B is still present on sidewalls of the gate stack 110B.

Figure 1G:
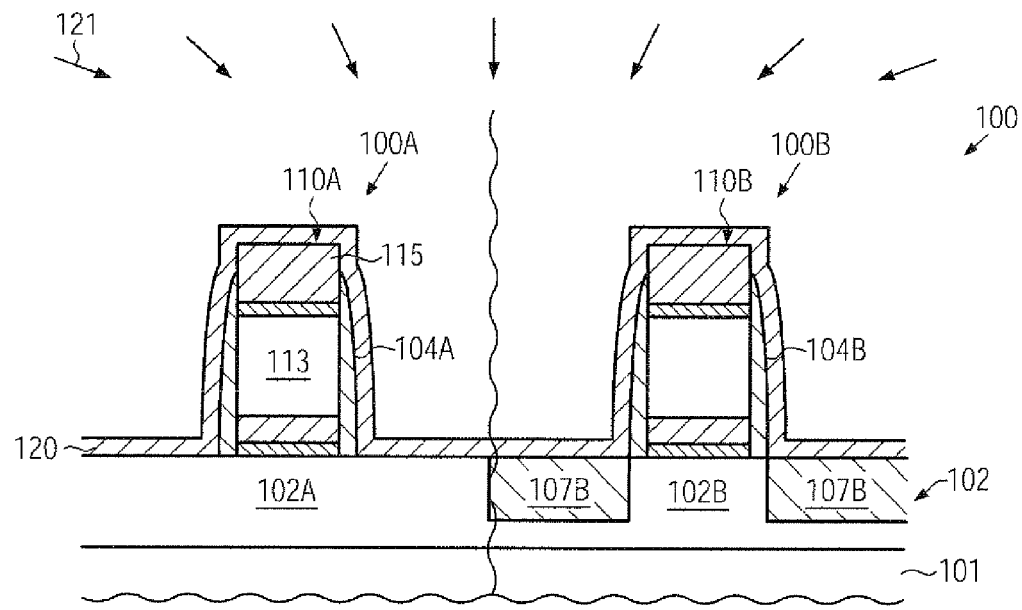

FIG. 1g schematically illustrates the semiconductor device 100 when exposed to a deposition ambient 121 in which a further spacer layer 120 may be formed above the transistors 100A, 100B, thereby also covering the corresponding spacers 104A, 104B. For example, the spacer layer 120 may be provided in the form of a silicon dioxide material, thereby providing a high degree of etch selectivity with respect to silicon-based materials, such as the material of the active regions 102A, 102B. It should be appreciated that any other material may be used, as long as a desired high etch selectivity of the layer 120 with respect to an etch chemistry may be obtained in which the cap layers 115 may be removed in a later manufacturing stage. For instance, other materials, such as high-k dielectric materials in the form of hafnium oxide and the like, may provide a high etch resistivity with respect to a plurality of etch recipes.

Figure 1H:
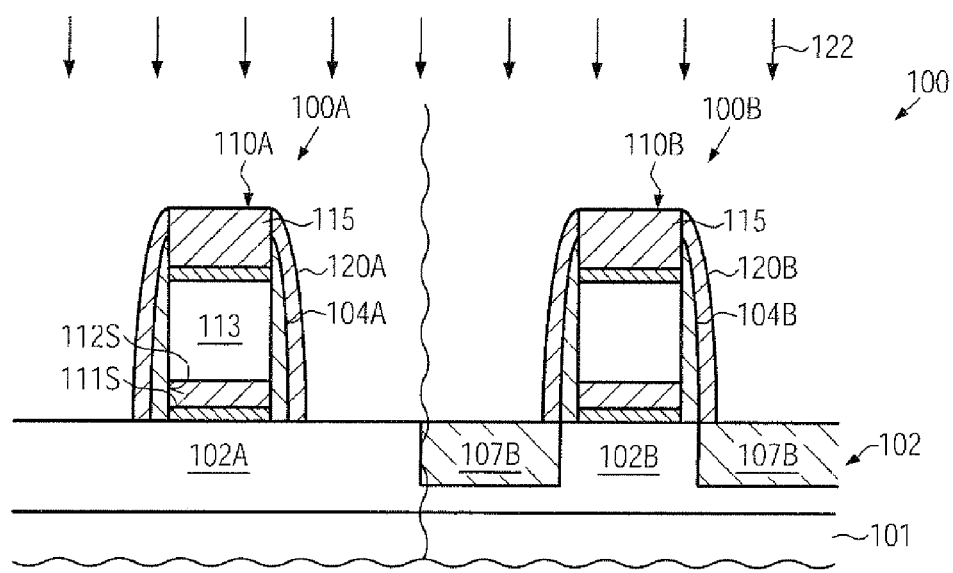

FIG. 1h schematically illustrates the semiconductor device 100 when exposed to an anisotropic etch process 122, which may be established on the basis of well-known etch chemistries in a plasma assisted ambient. For example, a plurality of anisotropic etch recipes for removing silicon dioxide material selectively to silicon-based materials are available and may be used during the process 122. Consequently, corresponding spacer elements 120A, 120B may be formed on the spacers 104A, 104B, thereby providing a reliable encapsulation of these spacer elements, at least around the side faces 111S, 112S. It should be appreciated that a pronounced selectivity with respect to the cap layer 115 and the spacers 104A, 104B may not be required during the etch process 122, as long as a pronounced height of the spacers 104A, 104B may be maintained.

Figure 1I:
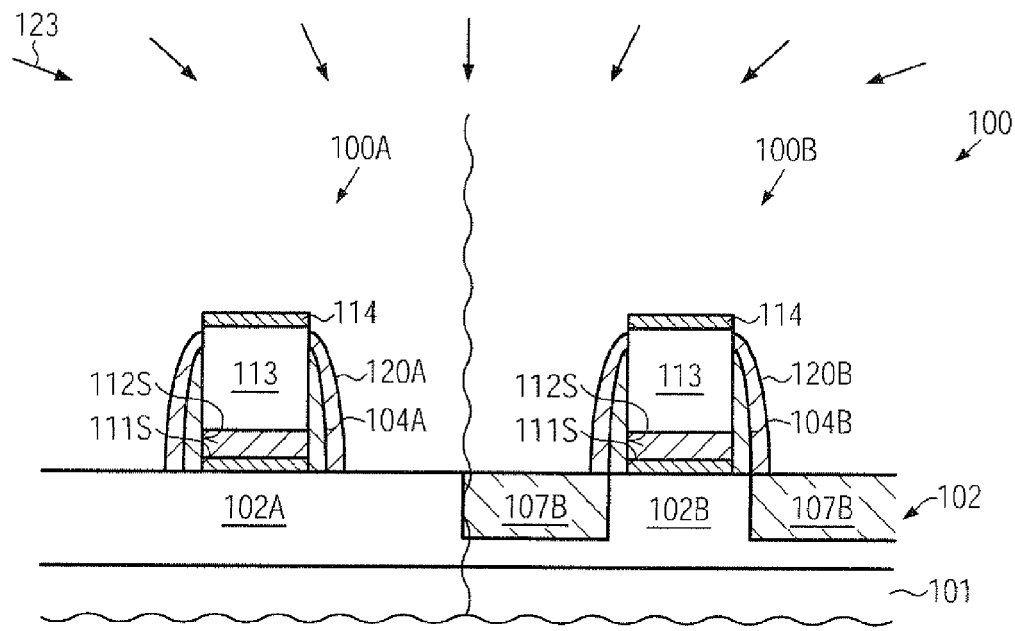

FIG. 1i schematically illustrates the semiconductor device 100 when exposed to a further etch process 123, in which the cap layers 115 (FIG. 1h) may be removed selectively to the spacers 120A, 120B and the material of the active regions 102A, 102B. For example, the etch process 123 may be performed on the basis of well-established wet chemical etch techniques, for instance using hot phosphoric acid for removing silicon nitride material selectively to oxide and silicon-based materials. Consequently, well-established etch techniques may be applied while still maintaining integrity of at least a portion of the spacers 104A, 104B due to the presence of the spacer elements 120A, 120B. Consequently, the cap layers 115 (FIG. 1h) may be reliably removed while maintaining integrity of the sidewall faces 112S, 111S. During the etch process 123, undue material removal of the material 113 may also be suppressed by the etch stop material 114, thereby ensuring a high degree of integrity of the remaining gate stacks 110A, 110B.

Figure 1J:
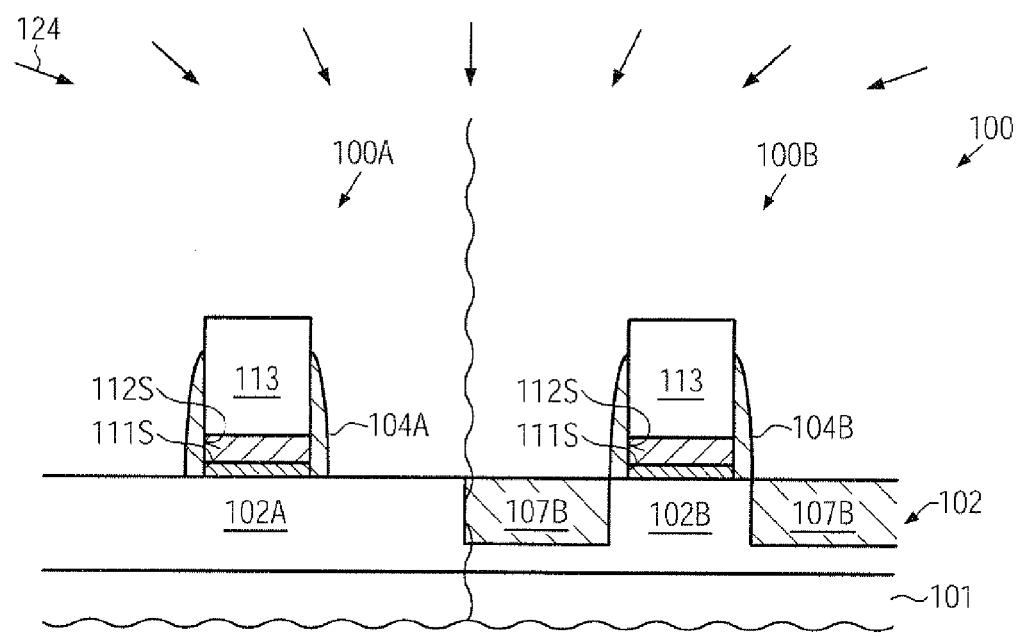

FIG. 1j schematically illustrates the semiconductor device 100 in a further advanced manufacturing stage in which the material 114 (FIG. 1i) may be removed on the basis of an appropriate etch process 124, which may also exhibit a high selectivity with respect to the material 113 and the active regions 102A, 102B. For example, the etch process 124 may be performed on the basis of diluted hydrofluoric acid (HF) and the like when the material 114 is comprised of silicon dioxide. During the etch process 124, the spacers 120A, 120B (FIG. 1i) may also be removed when comprised of a silicon dioxide material. In other cases, if considered appropriate, the spacers 120A, 120B may be maintained. Consequently, after the etch process 124, the gate stacks 110A, 110B may comprise the exposed materials 113 while the critical side surfaces 112S, 111S are still reliably covered by the spacer elements 104A, 104B. Hence, the further processing may now be continued on the basis of any appropriate manufacturing strategy in order to complete the transistors 100A, 100B.

Figure 1K:
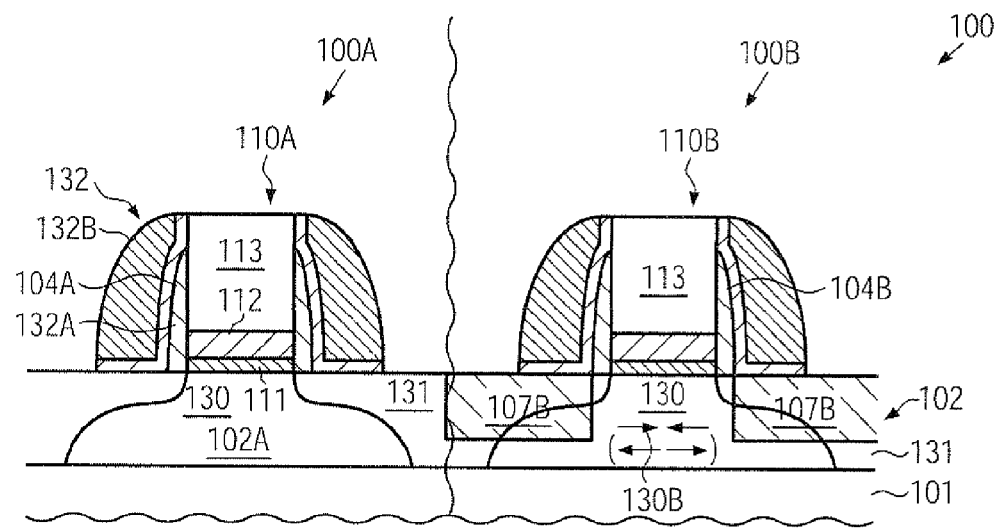

FIG. 1k schematically illustrates the semiconductor device 100 in a further advanced manufacturing stage in which a basic configuration of the transistors 100A, 100B may be completed. As illustrated, the gate stacks 110A, 110B may have formed on sidewalls thereof a spacer structure 132, which may comprise one or more individual spacer elements 132B, possibly in combination with an etch stop liner 132A, depending on the overall process strategy. Furthermore, the spacers 104A, 104B may separate at least a portion of the sidewalls of the gate stacks 110A, 110B from the corresponding spacer structure 132. In the embodiment shown, the gate stacks 110A, 110B may be provided on the basis of the material 113, for instance in the form of a doped polysilicon material, a doped silicon/germanium material and the like, while in other cases the material 113 may have been replaced by a further metal-containing material in order to even further enhance overall conductivity of the gate stacks 110A, 110B. Moreover, the transistors 100A, 100B may comprise drain and source regions 131, which may laterally confine a channel region 130. Moreover, in the transistor 100B, the drain and source regions 131 may be formed, at least partially, within the semiconductor alloy 107B, which in turn may provide an appropriate strain component 130B in the adjacent channel region 130 in order to enhance charge carrier mobility therein. For example, the transistor 100B may represent a transistor requiring a compressive strain component in order to enhance overall transistor performance. For instance, a P-channel transistor formed on the basis of a silicon-based material having a standard crystallographic configuration, i.e., a (100) surface orientation with a current flow direction, i.e., in FIG. 1k, the horizontal direction, oriented along a (110) crystallographic axis, may exhibit superior performance on the basis of a compressive strain component. In other cases, the transistor 100B may have superior performance upon applying a tensile strain component. For instance, for the above-specified crystallographic configuration, an N-channel transistor may exhibit a significantly increased performance by applying a tensile strain component in the channel region 130. Furthermore, since the semiconductor alloy 107B may be positioned close to the channel region 130, due to usage of the spacer 104B as an offset spacer upon forming the material 107B, even further enhanced performance may be achieved while nevertheless providing a high degree of integrity of the materials 112 and 111 during the preceding manufacturing processes. Hence, overall transistor variability may be reduced compared to conventional strategies.

The semiconductor device 100 as illustrated in FIG. 1k may be formed on the basis of any appropriate manufacturing strategy. For instance, the drain and source regions 131 may be formed on the basis of ion implantation, at least partially, by using the spacer structure 132 or a portion thereof as an efficient implantation mask. Thereafter, appropriate anneal processes may be performed to activate the dopant species and also re-crystallize implantation-induced damage. If required, a metal silicide may be formed in the drain and source regions 131, and possibly in the material 113, which may be accomplished by well-established silicide formation techniques. Thereafter, an interlayer dielectric material, or at least a portion thereof, may be deposited, possibly in a stressed state, to further enhance performance of one or both of the transistors 100A, 100B, which may be accomplished by well-established deposition techniques. In some illustrative embodiments, after providing a corresponding interlayer dielectric material or a portion thereof, the top surface of the gate stacks 110A, 110B may be exposed and the material 113 may be replaced by any appropriate metal-containing material, wherein an appropriate work function and thus threshold voltage may be adjusted for the transistors 100A, 100B.

With reference to FIGS. 1*l*-1*p*, further illustrative embodiments will now be described in which the number of lithography steps for forming the spacer elements 104A, 104B may be reduced.

Figure 1L:
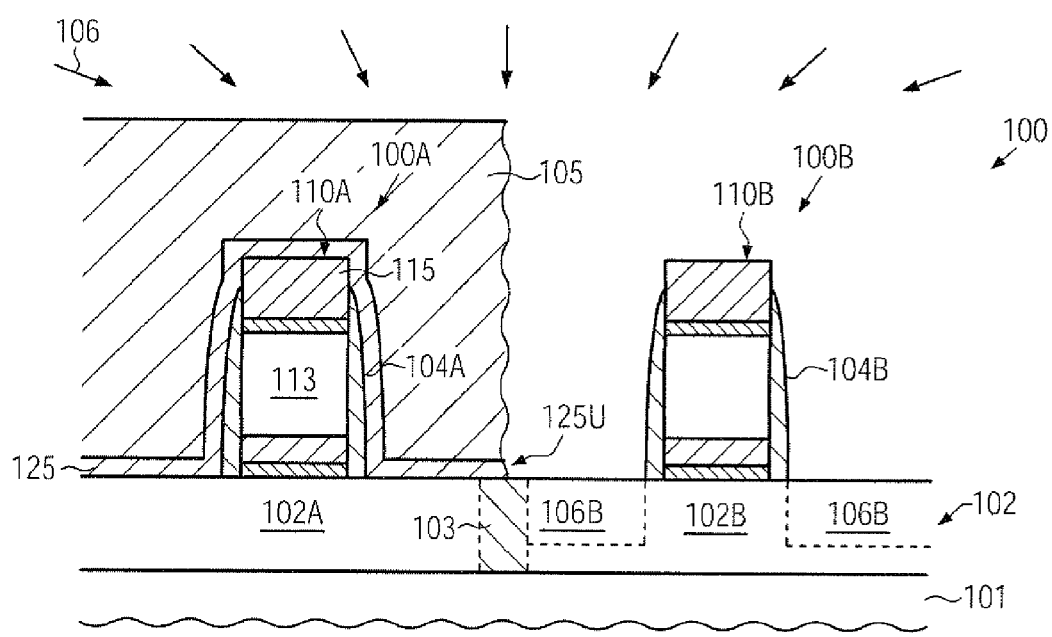

FIG. 1*l* schematically illustrates the semiconductor device 100 at a manufacturing stage in which the device 100 may be exposed to the etch ambient 106 for forming the cavities 106B on the basis of the spacer elements 104B. For this purpose, the etch mask 105 may cover the transistor 100A, as previously explained. In the embodiment shown, the transistor 100A may further be masked by a mask layer 125, for instance provided in the form of a silicon dioxide material and the like, so that the gate stack 110A and the active region 102A may be covered by the mask layer 125.

The semiconductor device 100 as illustrated in FIG. 1*l* may be formed on the basis of the following processes. After providing the gate stacks 110A, 110B, as previously described, the spacer layer 104 (FIG. 1*a*) may be formed and may be subsequently patterned by any appropriate anisotropic etch process, as previously explained, thereby providing the spacer element 104B and the spacer element 104A in a common etch process without requiring a dedicated lithography step. Thereafter, the mask layer 125 may be deposited on the basis of any appropriate deposition technique followed by the formation of the etch mask 105 based on the well-established lithography techniques. Thereafter, an exposed portion of the mask layer 125 may be removed by any appropriate etch process, such as exposure to hydrofluoric acid, followed by the etch process 106 in order to obtain the cavities 106B. It should be appreciated that a certain degree of under-etching, indicated as 125U, of the etch mask 105 may be acceptable since typically the under-etching 125U may occur above a corresponding isolation structure 103, without actually exposing the active region 102A. Consequently, a deposition mask, i.e., the mask layer 125 and the spacers 104A, 104B, may be provided on the basis of a single lithography step.

Figure 1M:
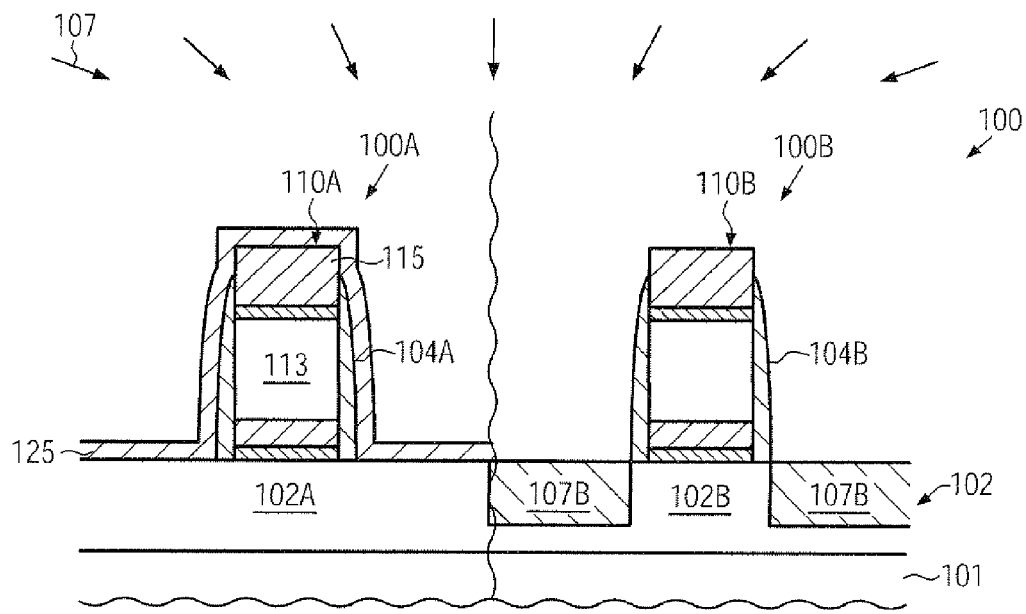

FIG. 1*m* schematically illustrates the semiconductor device 100 during the selective epitaxial growth process 107 during which the semiconductor alloy 107B may be formed in the active region 102B, as previously described, while the mask layer 125 may efficiently suppress material deposition above the transistor 100A.

Figure 1N:
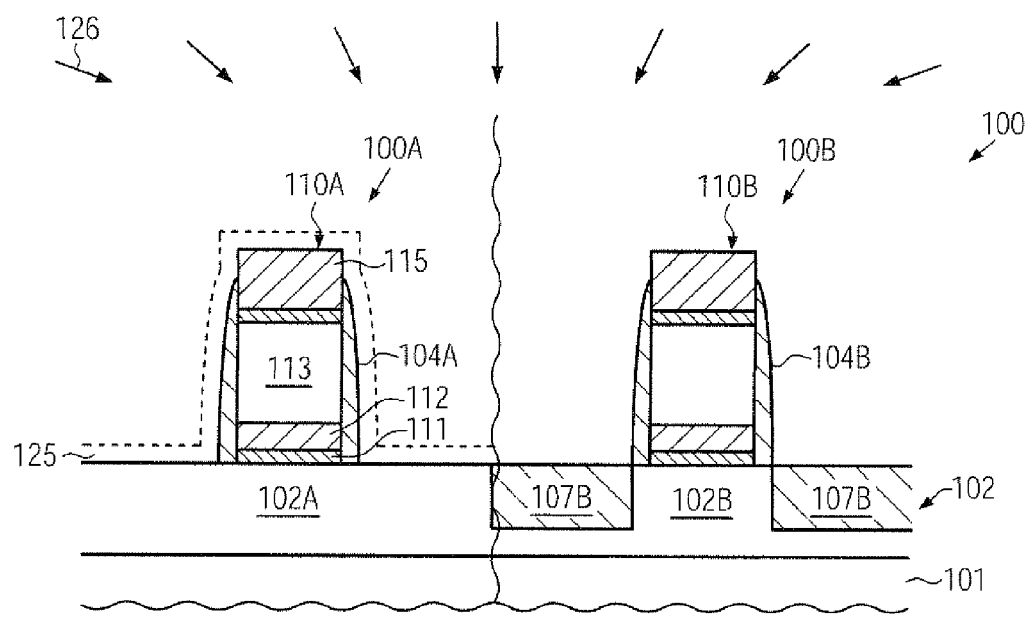

FIG. 1*n* schematically illustrates the semiconductor device 100 when exposed to a further selective etch ambient 126 which may be designed to remove the mask layer 125 selectively to the spacers 104A, 104B and the material of the active regions 102A, 102B. For this purpose, the etch process 126 may be performed on the basis of hydrofluoric acid, which is a well-known etch chemistry for removing silicon dioxide selectively with respect to silicon-based materials and silicon nitride. Hence, the spacers 104A, 104B and the cap materials 115 may be exposed in the transistors 100A, 100B while nevertheless ensuring integrity of the materials 112, 111. Consequently, in the manufacturing stage shown, the further processing may be continued, as described above, that is, the protective spacer elements 120A, 120B (FIG. 1*h*) may be formed and thereafter the cap layers 115 may be efficiently removed while still maintaining integrity of the spacers 104A, 104B, as described above.

Figure 1O:
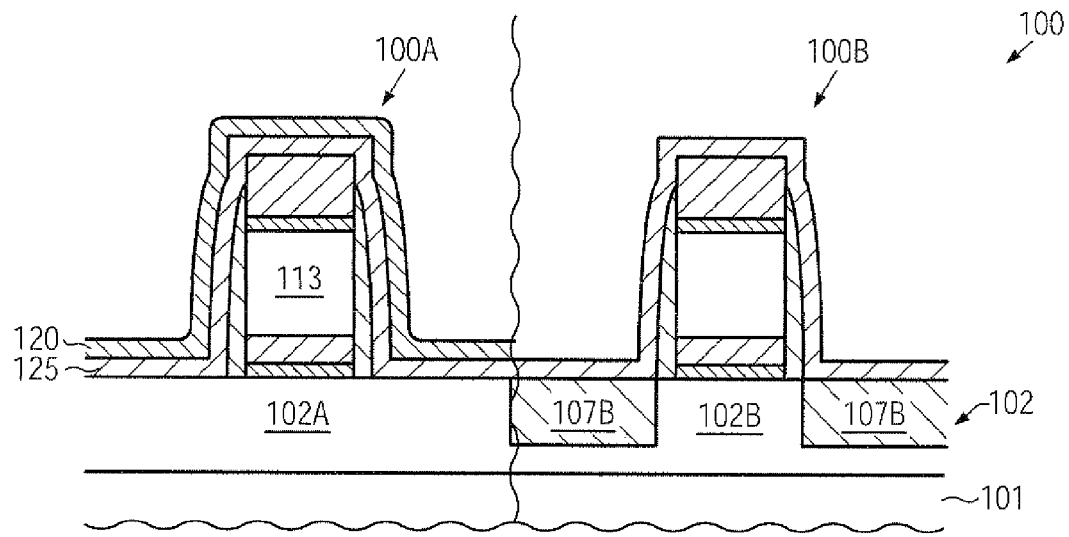

FIG. 1*o* schematically illustrates the semiconductor device 100 according to further illustrative embodiments in which the spacer layer 120 may be formed on the mask layer 125 and on the transistor 100B after forming the semiconductor alloy 107B. Hence, after using the mask layer 125 as a deposition mask during the preceding selective epitaxial growth process, the spacer layer 120 may be deposited on the basis of any appropriate deposition technique, wherein the materials 125 and 120 may be substantially the same or may have at least the same etch behavior during a subsequent process for forming spacer elements from the spacer layer 120 and the mask layer 125.

Figure 1P:
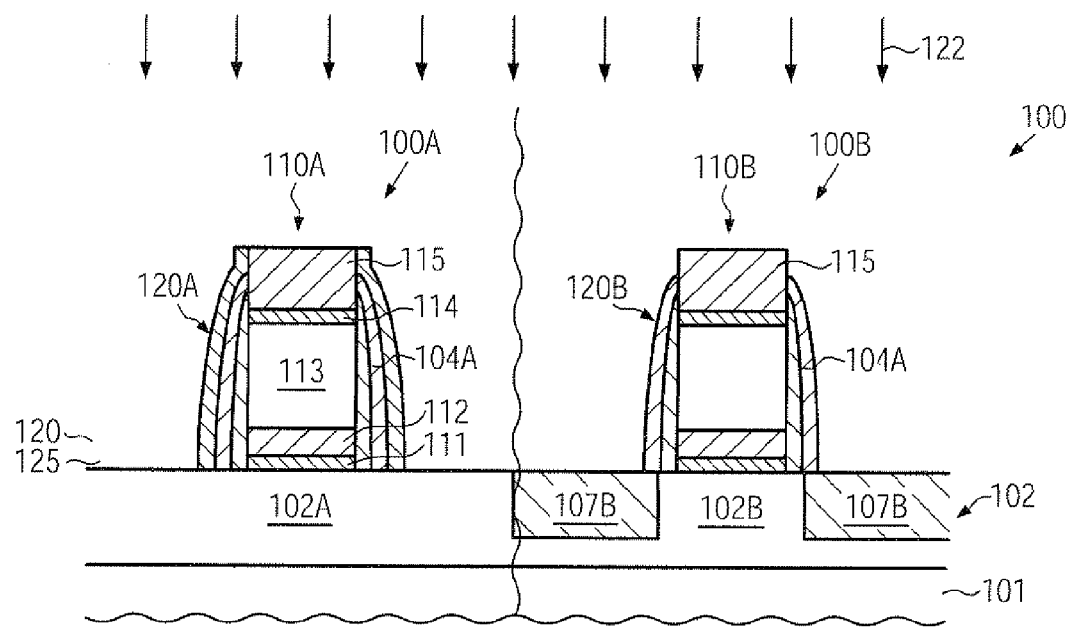

FIG. 1*p* schematically illustrates the semiconductor device 100 when exposed to the etch ambient of the process 122, i.e., the anisotropic etch process for forming the spacer element 120B on the spacer 104B from the spacer layer 120, and for forming the spacer element 120A from the spacer layer 120 in combination with the mask layer 125. During the etch process 122, a certain degree of "over-etching" of the transistor 100B may not have a substantially negative effect since, for instance, the spacer 120B may still reliably cover the spacer 104B, even if a height of the spacer 120B may be slightly reduced compared to the height of the spacer 120A. As a consequence, also in this case, the spacers 104A, 104B in combination with the spacers 120A, 120B may be provided on the basis of a reduced number of lithography steps while still maintaining integrity of the materials 111 and 112. Hence, in the embodiment shown in FIG. 1*p*, the further processing may be continued by removing the exposed cap layers 115, followed by the removal of the material 114 at the spacers 120A, 120B, as previously explained.

As a result, the present disclosure provides semiconductor devices and techniques for forming the same in which a spacer element may be used as a protective element for ensuring integrity of sensitive materials of a complex gate stack and concurrently for defining a lateral offset of a semiconductor alloy to be formed laterally adjacent to the gate stack. During the manufacturing sequence, the integrity of the protective spacer or offset spacer may be ensured by providing an additional sacrificial spacer element which, in some illustrative embodiments, may be accomplished without requiring an additional lithography process.

Consequently, in total, a reduced lateral offset of a strain-inducing semiconductor material may be accomplished without integrity of sensitive gate materials while not unduly contributing to process complexity.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a first spacer element on at least a first portion of sidewalls of a gate stack, said gate stack formed on a semiconductor layer and comprising a gate insulation layer comprising a high-k dielectric material, a gate electrode material and a cap layer formed above said gate electrode material;
    forming a semiconductor alloy in said semiconductor layer laterally offset from said gate stack on the basis of said first spacer element, wherein forming said semiconductor alloy comprises forming an etch mask, forming said first spacer element on the basis of said etch mask and forming cavities in said semiconductor layer using said etch mask;

forming a second spacer element on said first spacer element, said second spacer element contacting a second portion of said sidewalls of said gate stack;

removing said cap layer selectively to said second spacer element and said semiconductor alloy; and forming drain and source regions in at least a portion of said semiconductor alloy on the basis of said first spacer element.

2. The method of claim 1, wherein said first spacer element and said cap layer are comprised of silicon nitride.

3. The method of claim 1, wherein said electrode material comprises a metal-containing material formed on said gate insulation layer and wherein said first spacer element covers at least sidewall faces of said gate insulation layer and said metal-containing material.

4. The method of claim 1, wherein forming said semiconductor alloy further comprises filling said cavities with said semiconductor alloy after removing said etch mask by using said first spacer element and said cap layer as a deposition mask.

5. The method of claim 4, further comprising forming a first spacer layer above said gate stack and a second gate stack and forming said first spacer element from said spacer layer while covering said second gate stack by said etch mask.

6. The method of claim 5, further comprising forming a first spacer element of said second gate stack from said first spacer layer after forming said semiconductor alloy and prior to forming said second spacer element on said first spacer element of said first gate stack.

7. The method of claim 6, further comprising forming a second spacer layer above said gate stack and said second gate stack and forming said second spacer element on said first spacer elements of said gate stack and said second gate stack from said second spacer layer.

8. The method of claim 1, wherein said second spacer element is comprised of silicon dioxide.

9. The method of claim 1, wherein said semiconductor alloy comprises a compressive strain-inducing semiconductor material.

10. The method of claim 1, wherein said semiconductor alloy comprises a tensile strain-inducing semiconductor material.

11. A method, comprising:
forming a first offset spacer element at least on a portion of sidewalls of a first gate stack, said first gate stack being formed above a first semiconductor region;
forming a second offset spacer element at least on a portion of sidewalls of a second gate stack, said second gate stack being formed above a second semiconductor region, said first and second gate stacks comprising a high-k dielectric gate insulation layer, a metal-containing electrode material formed on said high-k dielectric gate insulation layer and a cap layer;
forming a deposition mask above said second semiconductor region, said deposition mask covering said second gate stack and said second offset spacer element;
forming an etch mask above said deposition mask;
forming cavities in said first semiconductor region by using said etch mask and said first offset spacer element as etch mask materials;
forming a semiconductor alloy in said cavities in said first semiconductor region by using said first offset spacer element as a mask; and removing said cap layers of said first and second gate stacks while maintaining at least a portion of said first and second offset spacer elements.

12. The method of claim 11, wherein removing said cap layers comprises forming a protection spacer element on said first and second offset spacer elements and etching said cap layers selectively to said protection spacer elements.

13. The method of claim 12, wherein forming said first offset spacer element and forming said second offset spacer element comprises forming a first spacer layer above said first and second semiconductor regions and forming said first and second offset spacer elements from said first spacer layer prior to forming said semiconductor alloy.

14. The method of claim 13, wherein forming said deposition mask comprises forming a mask layer above said first and second semiconductor regions, forming said etch mask and removing said mask layer from above said first semiconductor region on the basis of said etch mask.

15. The method of claim 14, wherein forming said semiconductor alloy comprises filling said semiconductor alloy in said cavities after removing said etch mask by using said mask layer as said deposition mask.

16. The method of claim 15, wherein forming said protection spacer comprises removing said mask layer, depositing a second spacer layer and forming said protection spacers from said second spacer layer.

17. The method of claim 15, wherein forming said protection spacer comprises forming a second spacer layer above said mask layer and said first semiconductor region and forming a first protection spacer from said second spacer layer above said first semiconductor region and forming a second protection spacer from said mask layer and said second spacer layer above said second semiconductor region.

18. A transistor device, comprising:
a gate electrode structure comprising a metal-containing electrode material formed on a gate insulation layer comprising a high-k dielectric material;
an active region comprising a channel region, drain and source regions and a strain-inducing semiconductor alloy; and
a spacer structure formed on sidewalls of said gate electrode structure, said spacer structure comprising a protection spacer, a spacer element, and an etch stop liner positioned between said protection spacer and said spacer element, wherein said protection spacer is in direct contact with a sidewall face of said gate insulation layer, said etch stop liner is in contact with a sidewall portion of said gate electrode structure, and said protection spacer has a width that is substantially equal to a lateral offset of said strain-inducing semiconductor alloy from said sidewall face.

19. The transistor device of claim 18, wherein said protection spacer has a width of approximately 2 nm or less.

20. The transistor device of claim 18, wherein said protection spacer is comprised of silicon nitride.

21. The transistor device of claim 18, wherein a length of said gate electrode structure is approximately 50 nm or less.

22. The transistor device of claim 21, wherein said strain-inducing semiconductor alloy induces a compressive strain in said channel region.

23. The transistor device of claim 21, wherein said strain-inducing semiconductor alloy induces a tensile strain in said channel region.

24. The method of claim 1, further comprising removing said second spacer element and forming a spacer structure on said first spacer element, said spacer structure comprising an etch stop liner and a third spacer element formed on said etch stop liner.

25. The method of claim 12, wherein forming said protection spacer elements comprises forming at least one of said protection spacer elements in contact with a portion of said sidewalls of a respective one of said first and second gate stacks.

* * * * *